US006812435B2

(12) United States Patent
Schilling

(10) Patent No.: US 6,812,435 B2
(45) Date of Patent: Nov. 2, 2004

(54) OPERATING DEVICE FOR AN ELECTRICAL APPLIANCE

(75) Inventor: Wilfried Schilling, Kraichtal (DE)

(73) Assignee: E.G.O. Elektro-Geraetebau GmbH (DE)

( * ) Notice: Subject to any disclaimer, the term of this patent is extended or adjusted under 35 U.S.C. 154(b) by 0 days.

(21) Appl. No.: 10/391,954

(22) Filed: Mar. 18, 2003

(65) Prior Publication Data

US 2003/0178291 A1 Sep. 25, 2003

(30) Foreign Application Priority Data

Mar. 19, 2002 (DE) .......................................... 102 12 929

(51) Int. Cl.⁷ ........................... H01L 43/02; H05B 3/02; H01H 36/00; H01H 3/00
(52) U.S. Cl. ...................... 219/457.1; 200/18; 219/507; 219/508; 335/205; 338/12; 338/32 H; 307/115
(58) Field of Search ................................ 335/205–208; 338/12, 32 R, 32 H; 200/18; 219/457.1, 507, 508, 620, 627; 307/104–116

(56) References Cited

U.S. PATENT DOCUMENTS

| | | | |
|---|---|---|---|
| 3,818,393 A | * | 6/1974 | Morgott ...................... 335/206 |
| 4,812,804 A | * | 3/1989 | Masaki ........................ 338/200 |
| 4,983,812 A | * | 1/1991 | Worrall et al. ............ 219/445.1 |
| 5,920,131 A | * | 7/1999 | Platt et al. ................... 307/104 |
| 6,153,837 A | | 11/2000 | Garcia et al. |
| 6,498,326 B1 | | 12/2002 | Knappe |

FOREIGN PATENT DOCUMENTS

| DE | 44 32 399 C2 | 3/1996 |
|---|---|---|
| DE | 100 63 693 C1 | 8/2002 |

* cited by examiner

Primary Examiner—James R. Scott
(74) Attorney, Agent, or Firm—Akerman Senterfitt

(57) ABSTRACT

In an embodiment of the invention an operating device for a glass ceramic hob (25) can be provided and has an operating unit (11). The operating unit (11) has a rotary toggle (12), which is magnetically mounted on a glass ceramic hob (25). A bearing device (13) below the glass ceramic hob has guide magnets (15), which form a magnetically acting guide link, which permits both a rotary movement (R) and a linear movement (L) of the rotary toggle (12). The rotary toggle (12) has signalling magnets (19) along its outer circumference and with them are associated beneath the hob (25) Hall sensors (21). Further Hall sensors (22) are positioned between the guide magnets (15). A random movement (R, L) of the rotary toggle (12) can be detected with the Hall sensors (21, 22). The operating unit (11) can be removed. The glass ceramic hob (25) requires no openings or the like.

20 Claims, 3 Drawing Sheets

OPERATING DEVICE FOR AN ELECTRICAL APPLIANCE

FIELD OF APPLICATION AND PRIOR ART

The invention relates to an operating device for an electrical appliance, preferably an electrical heating appliance such as a cooker.

DE 198 59 105 discloses an operating device for an electrical appliance having a type of magnetic sliding key. The sliding key is placed on a glass ceramic plate of a cooker and has a magnetic guide. By so-called keying, i.e. linear movements in different and in particular opposing directions, it is possible to release switching signals and therefore operate the electrical appliance. However, only a limited number of operating functions is possible.

PROBLEM AND SOLUTION

The problem of the invention is to provide an operating device for an electrical appliance permitting further extensions to operating functionalities.

This problem is solved by an operating device having the features of claim 1. Advantageous and preferred developments of the invention form the subject matter of further claims and are described in greater detail hereinafter. By express reference the wording of the claims is made into part of the content of the description.

According to the invention the operating device and in particular the entire operating means, which can in particular assume the complete operation of at least one functional unit of the electrical appliance, has an operating unit with a rotary toggle. A rotary toggle has the advantage that radial position signals can be very readily differentiated. On generating a position signal as a function of a specific rotation, in the case of several rotations of the rotary toggle a randomly large number of position signals can be generated.

The rotary toggle is mounted so as to rotate on a bearing device forming part of the operating device. There are also signalling means with which, as a function of a position and/or a position change of the rotary toggle, signals can be generated. For processing said signals the operating device has a control mechanism. As a function thereof the electrical appliance or a functional unit thereof is influenced or controlled.

According to the invention, in addition to a rotary movement, the rotary toggle is movably mounted in at least one direction in such a way that it can perform a linear movement. For this purpose further signalling means are provided for detecting the linear movement of the rotary toggle and which can be converted into signals for the control mechanism.

Thus, a combined rotary-sliding toggle for operating an electrical appliance is created. It is advantageously possible by a linear or sliding movement in a specific direction to make a specific choice for a power scale or the like. This power scale can then be adjusted by a subsequent rotary movement. It is also possible by means of a rotary movement to pass or leaf through a menu. With a corresponding linear movement it is then possible to jump into a submenu or to perform a selection or confirmation.

According to a further development of the invention, the bearing device can be constructed in such a way that the operating unit is removably fixed to a cover of the electrical appliance. For this purpose a holding power is provided, which is preferably non-contacting or has an external power effect. Advantageously use is e.g. made of holding magnets, which can be provided in the bearing device and/or on the electrical appliance cover. With such a construction it is possible to remove the operating unit, e.g. for safety reasons. This also makes it possible to operate several electrical appliances with the same operating unit.

The rotary toggle can be rotated about a rotation axis and in particular a single rotation axis. A linear movement advantageously takes place substantially radially thereto. In particular, the bearing device is constructed in such a way that the rotary toggle is automatically reset following the performance of a linear movement or following release. As a result the rotary toggle more particularly and in particular exclusively can perform the rotary operation in one position, which is advantageously a middle or normal position.

In a particularly preferred development of the invention not only is the operating unit constructed so as to be removable from the cover, but this also applies to at least most of the bearing device. It is possible for the rotary toggle and bearing device to form a constructional unit or a separate operating unit. The latter can be fixed in different ways to a cover or the like of an electrical appliance and held there. It is merely necessary to either place the signalling means on the cover or, if they are also provided in the operating unit, to have a signal transmission from the operating unit to the electrical appliance. This can make it possible to bring about a simpler construction of the electrical appliance. The operating functionalities together with the detection of position signals are completely present in the operating device.

The bearing device can have a type of base plate or case, which can be fixed or engaged on the cover. The base plate is preferably fixed to the cover by external power action, which can be magnetically.

According to a further development of the invention it is possible for the rotary toggle to perform the linear movement relative to a base plate or mounting support of the bearing device. Alternatively or additionally it is possible for the rotary toggle and base plate to perform a linear movement with respect to the cover. Thus, the linear movement of the rotary toggle can take place either with respect to the base plate or, together with said base plate, with respect to the cover.

A guidance of the linear movement and in particular also the rotary movement can take place advantageously in contact-free manner by external power action, such as by magnetic power or force. Thus, such a guidance involves a certain expenditure. However, it has the advantage of being free from wear and of permitting a closed surface of the cover. Alternatively it is possible for certain variants of the invention to have guidance by mechanical guidance means.

Part of the signalling means are advantageously provided in the rotary toggle and can be a functional half of signalling means comprising at least two cooperating parts. Advantageously the signalling means or the other functional half of the signalling means can be located on the bearing device or on a base plate of the latter. It is also possible to provide the signalling means or the other functional half thereof below the cover. Rotary and linear movements can be detected by said signalling means.

According to a further development of the invention the operating unit can contain display means making it possible to display optical effects, operating parameters or settings. For this purpose lighting means can be provided on a display in order to draw the attention of the observer thereto.

In an embodiment of the invention a display can be provided in the rotary toggle. As the latter can be removed from the electrical appliance and is to have no electric lines or connections, the power transmission for the display means can have a transformer-like construction. For this purpose corresponding coils can be provided on the cover, as well as the rotary toggle or bearing device.

The signalling means can also have position determining means with which it is possible to determine a position, preferably also the rotation angle position of the rotary toggle relative to a reference point or dead centre of the cover. For this purpose they can have, particularly as in each case one functional half of the signalling means, at least one signalling or signal magnet and at least one magnetic field sensor or Hall sensor. Advantageously there are several magnetic field sensors, which can in each case detect one position change of a signalling magnet. The magnetic field sensors are advantageously located in the movement path of the rotary toggle or the corresponding signalling magnets.

To permit a clear detection of an operation of the rotary toggle as a linear operation, but so that it is appropriate for use, not too complicated or costly and can be readily detected, up to the release of a signal or up to a stop member, it should be shorter than the radius of the rotary toggle or the extension of the latter in the operating direction. This makes it possible to leave the dead centre of the rotary toggle, which is advantageously used as the point predetermining the linear operation, within the extension of the rotary toggle in the inoperative position.

These and further features can be gathered from the claims, description and drawings and the individual features, both singly and in the form of subcombinations, can be implemented in an embodiment of the invention and in other fields and can represent advantageous, independently protectable constructions for which protection is claimed here. The subdivision of the application into individual sections and the subheadings in no way restricts the general validity of the statements made thereunder.

BRIEF DESCRIPTION OF THE DRAWINGS

Embodiments of the invention are described in greater detail hereinafter relative to the attached diagrammatic drawings, wherein show.

DETAILED DESCRIPTION OF EMBODIMENTS

Figure 1:
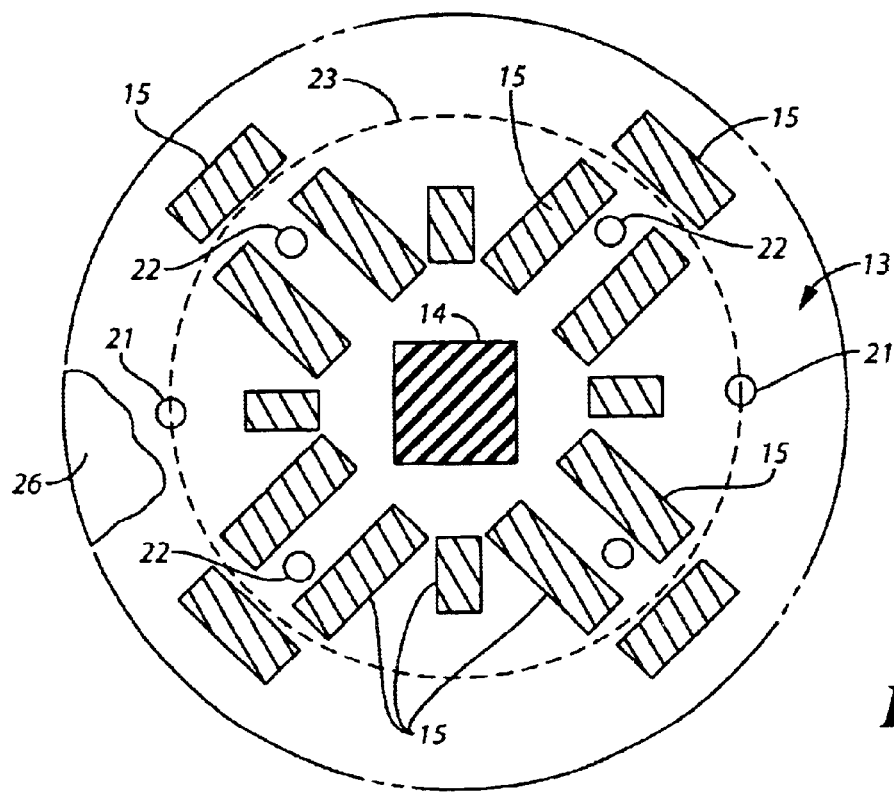
FIG. 1 A plan view of a bearing device, formed by guide magnets, together with Hall sensors and a cover.
Figure 3:
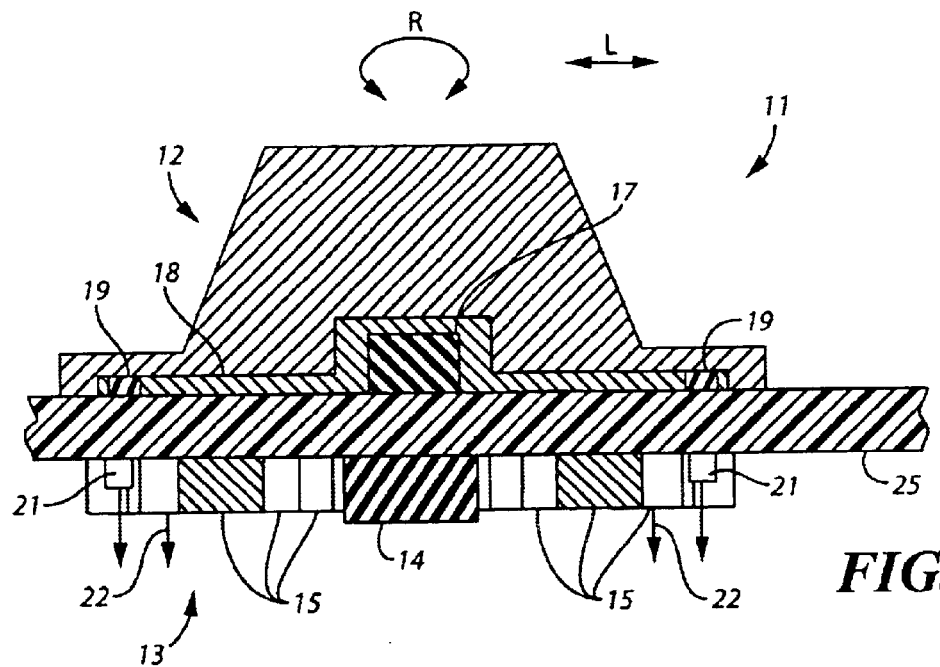
FIG. 3 An operating unit comprising a rotary toggle and a bearing device under a glass ceramic hob.
Figure 4:
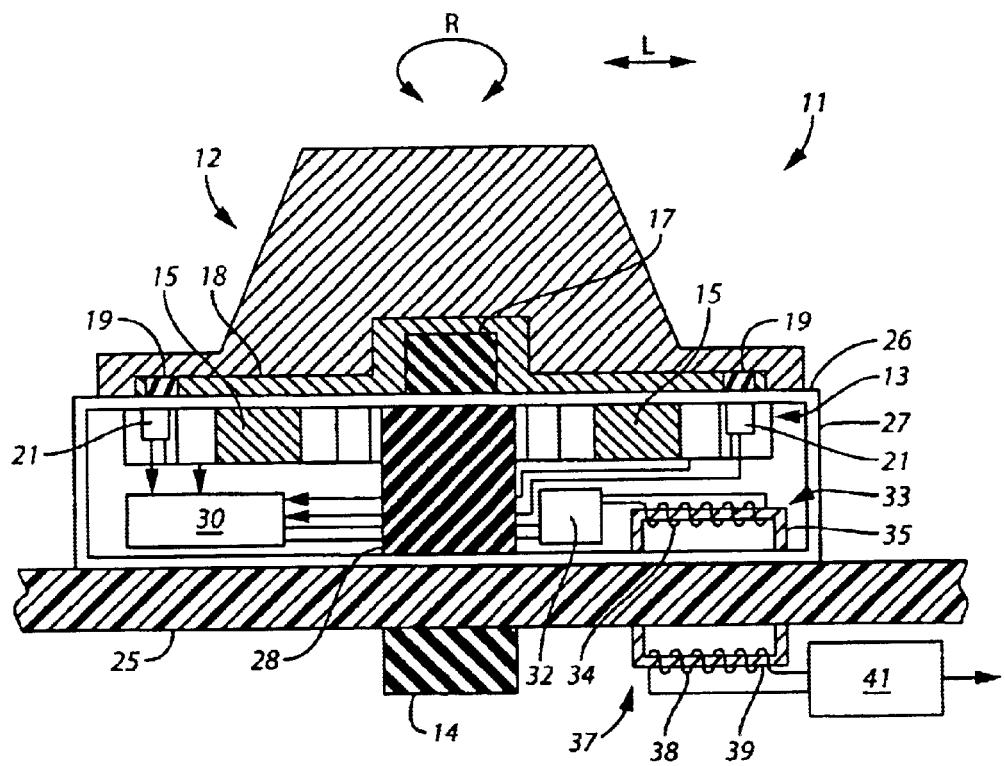
FIG. 4 An operating unit with a rotary toggle, which is removably mounted on a holding module, which is in turn removably retained on a glass ceramic hob.

FIG. 1 shows a bearing device 13 for an operating unit 11, as can be seen in lateral section in FIGS. 3 and 4. The bearing device 13, as can be gathered from the two aforementioned drawings, can either be placed under a glass ceramic hob 25 or below the top surface 26 of a holding module 27.

The bearing device 13 has a first central magnet 14 used for centring the rotary toggle 12. There are also several guide magnets 15 arranged around the first central magnet 14 and which form, as can be seen clearly in FIG. 1, a linear guide for the rotary toggle 12. The arrangement roughly corresponds to a guide link, such as could also be constructed according to the invention for mechanical guides. In connection with the construction of the bearing device 13 or the arrangement of the guide magnets 15, it is mainly a question of forming a closed border with several longitudinally extending areas. At the end of the longitudinal areas is once again provided a guide magnet 15 for limitation purposes.

The corresponding second part of the bearing device 13 provided in a rotary toggle 12 has a second central magnet 17, which is placed on a pole cross 18 in the rotary toggle 12. Signalling or signal magnets 19 are provided at the ends of the arms of the pole cross 18. The pole cross 18 has five arms in the embodiment shown here, but in variants of the invention it can have more or less arms. The number of pulses per rotary movement is essentially determined by the number of arms of the pole cross 18, in conjunction with the corresponding Hall sensors.

On rotating in the rotation direction R in the inoperative and without linear movement, the signalling magnets 19 run on the rotation circle 23 shown in broken line form. As is apparent from FIG. 1, along said rotation circle 23 and belonging to the bearing device are provided Hall sensors 21 for detecting a rotation R. There are two Hall sensors 21 in FIG. 1. This principle is adequately known and needs no further explanation here.

Between the guide magnets 15 in the outer part of the longitudinal areas there are further Hall sensors 22 for detecting a longitudinal movement L. The switching signals are initiated in that the second central magnet 17 leaves the attraction area over the first central magnet 14. It is brought into one of the longitudinal areas and guided along the same. As soon as the second central magnet 17 comes over one of the Hall sensors 12, a corresponding switching signal is initiated and means the performance of a linear movement L.

As can be gathered from FIGS. 1 to 4, the first central magnet 14 and second central magnet 17 attract, because they have antithetic polarity, as is made clear by the differing hatching. As the second central magnet 17 in rotary toggle 12 and the guide magnets 15 have the same polarity, they repel one another. Thus, a certain guidance with a noticeable guidance force of the second central magnet 17 is possible over the channels or longitudinal areas formed by the guide magnets 15.

Although it is clear that the guidance of the rotary toggle 12 both during a rotary movement R and during a linear movement L through the magnets is not sufficiently strong to prevent it from leaving the same, the provision of corresponding magnets can produce a guiding force of adequate magnitude to give a user a clearly noticeable feeling for the movements provided.

This makes it clear that a mechanical guidance could be provided in place of a magnetic guidance. In place of the second central magnet 17, it would be possible for a type of guide pin to engage in the slotted guide links, which correspond to the longitudinal areas of the guide magnets 15. Instead of magnetic sensors it would be possible to use mechanical switches, e.g. microswitches. It would naturally also be possible for a guide pin to be magnetic for the use of magnetic sensors.

FIGS. 3 and 4 show two different constructions of an operating unit 11 according to the invention.

In the operating unit 11 of FIG. 3, below a glass ceramic hob 25 is fitted the bearing device 13 according to FIG. 1. It can be mechanically pressed or adhered to the underside.

Above the bearing device 13 the rotary toggle 12 is placed on the glass ceramic hob 25. This permits both a predetermined mounting and also a guidance during movements R and L. The magnets 17 and 19 act adequately through the glass ceramic material on the Hall sensors 21 and 22, so that the movements can be detected. In this embodiment the rotary toggle 12 can be removed. Then all that is left is the smooth, closed surface of the glass ceramic hob 25.

Not shown lines pass from the Hall sensors 21, 22 to a not shown control mechanism, which evaluates the signals of the Hall sensors as a corresponding operation. This control mechanism can be designed in accordance with known criteria and advantageously has a microcontroller.

In the second embodiment according to FIG. 4, the bearing device 13 with the guide magnets 15 is not placed below the closed glass ceramic hob 25. Here a holding module 27 is provided and on it can be mounted the rotary toggle 12. Essentially the holding module 27 contains a significant part of the means provided below the glass ceramic hob 25 in FIG. 3, i.e. the bearing device 13, a third central magnet 28 corresponding to the first central magnet 14, together with the Hall sensors 21 and 22.

As the holding module 27 is placed on the closed surface of the glass ceramic hob 25 and a signal transmission is to be connected to a control mechanism for functional units of the glass ceramic hob, further devices are required. These include the third central magnet 28, which holds the holding module 27 on the first central magnet 14 under the glass ceramic hob 25. It also replaces the first central magnet 14 according to FIG. 3 for the second central magnet 17 in rotary toggle 12.

A microcontroller 30 is also provided and is connected to the Hall sensors 21, 22. An evaluation of the Hall sensor signals and therefore a rotary toggle movement R or L can be evaluated in the microcontroller 30. The signals are now to be transmitted to a control mechanism beneath the glass ceramic hob 25. For this purpose the microcontroller 30 is connected to a first converter 32 as an electronic component. The first converter 32 is in turn connected to a first transformer 33 comprising a first coil 34 and a first ferrite core 35.

A second transformer 37 below the glass ceramic hob 25 is associated with the first transformer 33 in the holding module 27. The second transformer 37 has a second coil 38 and a second ferrite core 39. A second converter 41 is correspondingly connected to the second transformer 37 and transmits the signals received to a not shown control mechanism.

The converters 32, 41 convert the signals of the microcontroller 30 for transmission purposes. It is also possible to bring about a power supply of the holding module 27 across the transformers 33, 37. Advantageously an inductive power transmission is implemented for this purpose. So that a signal transmission in one or both directions is not disturbed, power transmission and signal transmission should take place in time-displaced manner and preferably during so-called time slots. This is adequately known from the prior art and need not be explained further here.

It is possible in this way to supply power from the exterior to the devices in the holding module 27, particularly the microcontroller 30, obviating the need for batteries or accumulators.

It is also possible to equip the holding module 27 and/or rotary toggle 12 with display means or a lighting system. For this purpose the holding module 27 can directly have a display. It would also be possible to have an inductive power transmission from the holding module 27 into the rotary toggle 12 in contactless manner on displays provided there. Thus, the rotary toggle 12 could carry a display, e.g. at its upwardly directed side. This display would indicate to a user different operating states and/or provide instructions for implementing stored cooking programs.

Figure 2:
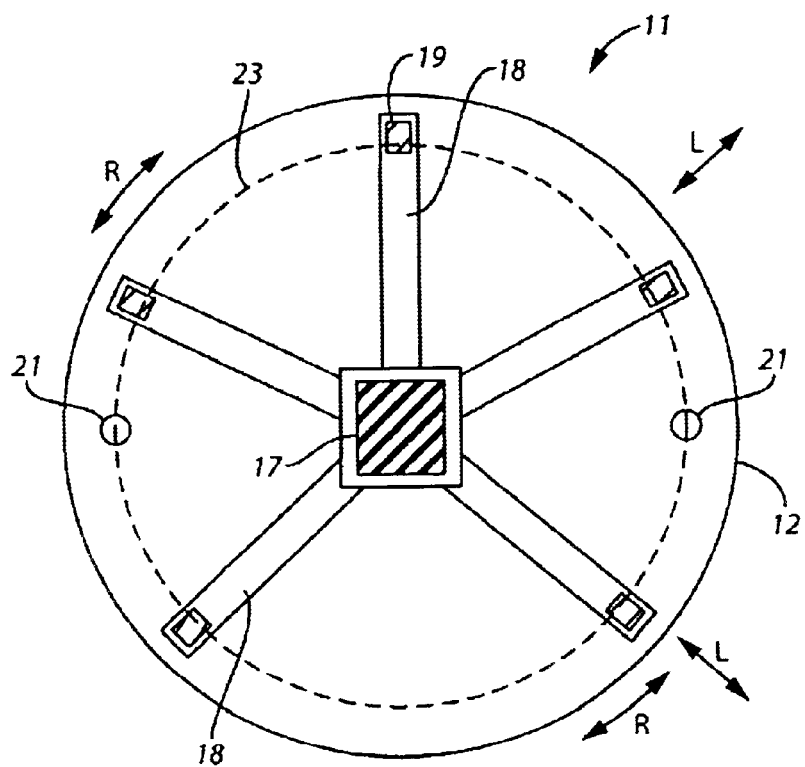
FIG. 2 A diagrammatic sectional view through a rotary toggle with a pole cross, which contains a central magnet and externally positioned signalling magnets.
Figure 5:
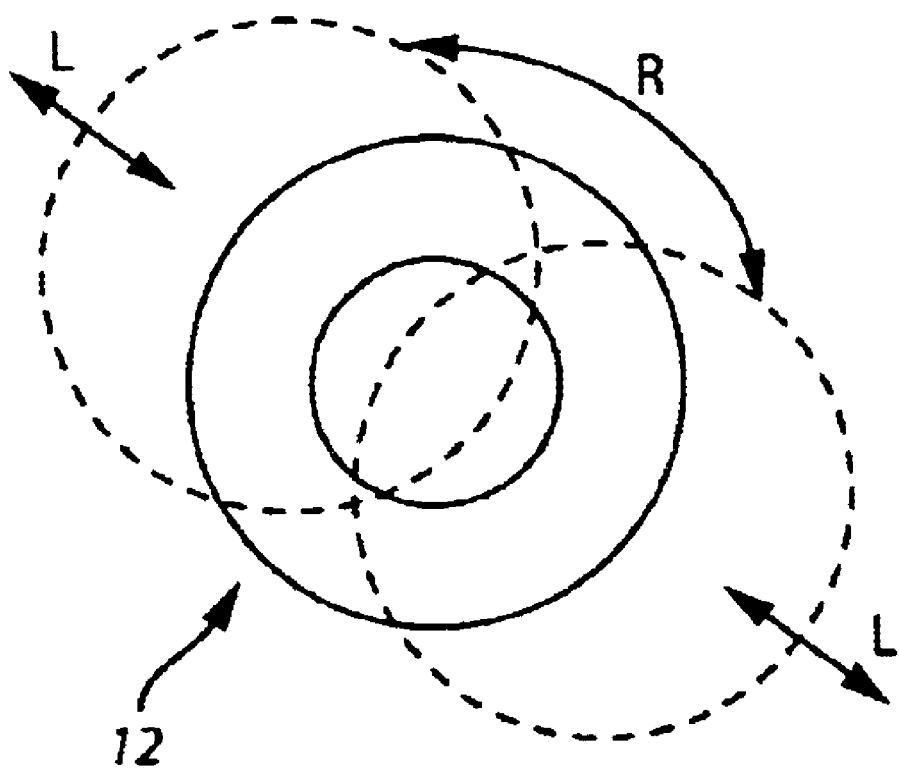
FIG. 5 An exemplified movement range of the rotary toggle with respect to linear movements.

FIG. 5 shows how a rotary toggle 12 according to the general inventive concept can be linearly displaced from an inoperative position either with the linear movements L or rotated with a radial movement R. According to the general inventive concept, the rotary toggle 12 is constructed in such a way that it maintains a set rotary position. However, following a linear displacement L it returns automatically to the inoperative position. This offers the advantage that, as can be seen in FIGS. 1 and 2, a detection of a rotary movement R can more particularly take place in the inoperative position, whilst the magnets 14 and 17 are superimposed.

An operating unit 11 according to FIG. 4 could e.g. be fixed to other electrical appliances for the operation thereof. For this purpose there would be no need to provide an entire bearing device 13 on the electrical appliance in accordance with FIG. 3. It would be adequate, according to FIG. 4, to provide a single holding magnet 14 and a single transformer 37. It is generally also conceivable to perform signal transmission with a spark gap or electromagnetic waves, e.g. IR radiation. In this case transformers 33 and 37 would be replaced by corresponding transmission means. However, then, generally no power transmission is possible.

What is claimed is:

1. Operating device for an electrical appliance, wherein
the operating device has an operating unit,
the operating unit has a rotary toggle,
the operating device has a bearing device for the rotary toggle,
the rotary toggle is mounted so as to rotate on the bearing device,
signalling means are provided for generating signals as a function of a position and/or position change of the rotary toggle,
the operating device has a control mechanism,
the control mechanism processes the signals for influencing the electrical appliance,
the rotary toggle is additionally mounted so as to have a linear movement in at least one direction and
the signalling means are also constructed for detecting the linear movement of the rotary toggle.

2. Operating device according to claim 1, wherein the electrical appliance has a cover and the operating unit is removably fixed to the cover of the electrical appliance by means of a holding power.

3. Operating device according to claim 2, wherein the holding power is non-contacting and has holding magnets in the bearing device or on the electrical appliance cover.

4. Operating device according to claim 1, wherein the rotary toggle is mounted so as to rotate about a rotation axis and the linear movement takes place substantially radially to the rotation axis.

5. Operating device according to claim 4, wherein the bearing device is constructed in such a way that, after performing the linear movement, the rotary toggle is automatically reset.

6. Operating device according to claim 2, wherein the bearing device is constructed separately from the cover and forms together with the rotary toggle the constructional unit of the operating unit.

7. Operating device according to claim 6, wherein the bearing device has a base plate for engaging on the cover.

8. Operating device according to claim 1, wherein there is a linear movement of the rotary toggle with respect to a base plate of the bearing device.

9. Operating device according to claim 2, wherein there is a linear movement of the rotary toggle and the base plate of the bearing device with respect to the cover.

10. Operating device according to claim 1, wherein the guidance of the linear movement takes place essentially in non-contacting manner through magnetic force.

11. Operating device according to claim 1, wherein the linear movement is guided by mechanical guidance means.

12. Operating device according to claim 1, wherein part of the signalling means is provided in the rotary toggle.

13. Operating device according to claim 12, wherein the bearing device has a base plate and wherein part of the signalling means is located in the base plate.

14. Operating device according to claim 12, wherein the electrical appliance has a cover and wherein part of the signalling means is positioned below the cover and fixed to the cover.

15. Operating device according to claim 1, wherein display means are provided in the operating unit.

16. Operating device according to claim 15, wherein the display means include lighting means.

17. Operating device according to claim 1, wherein the cover has a reference point and wherein the signalling means have position determination means for determining the position of the rotary toggle with respect to the reference point.

18. Operating device according to claim 17, wherein the signalling means have position determination means for determining the position and also the rotation angle position of the rotary toggle with respect to the reference point.

19. Operating device according to claim 17, wherein the position determination means comprise at least one signalling magnet and at least one magnetic field sensor.

20. Operating device according to claim 1, wherein the rotary toggle has a bodily extension in at least one direction and wherein the linear movement in this direction up to the release of a signal or up to a stop member is shorter than the bodily extension of the rotary toggle in this direction.

* * * * *